United States Patent [19]

Ono et al.

[11] Patent Number: 5,175,114

[45] Date of Patent: Dec. 29, 1992

[54] METHOD FOR PRODUCTION OF A BIDIRECTIONAL NONLINEAR RESISTOR, ACTIVE MATRIX LIQUID CRYSTAL PANEL USING BIDIRECTIONAL NONLINEAR RESISTOR

[75] Inventors: Yoshihiro Ono; Fumiaki Matsushima, both of Nagano; Tetsuya Osaka, Tokyo, all of Japan

[73] Assignee: Seiko Epson Corporation, Tokyo, Japan

[21] Appl. No.: 463,761

[22] Filed: Jan. 12, 1990

[30] Foreign Application Priority Data

| Jan. 13, 1989 | [JP] | Japan | 1-6446 |
| Apr. 4, 1989 | [JP] | Japan | 1-85371 |
| Apr. 4, 1989 | [JP] | Japan | 1-85372 |
| Apr. 4, 1989 | [JP] | Japan | 1-85373 |
| Apr. 4, 1989 | [JP] | Japan | 1-85374 |
| Nov. 6, 1989 | [JP] | Japan | 1-288402 |

[51] Int. Cl.⁵ .................. H01L 21/02; H01C 7/00; G02F 1/133
[52] U.S. Cl. .................. 437/1; 437/81; 437/181; 437/918; 29/25.02; 359/74; 257/40
[58] Field of Search .............. 437/1, 81, 181, 189, 437/914, 918; 357/8; 350/334, 339 R; 29/25.02; 359/74, 36

[56] References Cited

U.S. PATENT DOCUMENTS

| 4,532,188 | 7/1985 | Naarmann et al. | 437/1 |
| 4,609,971 | 9/1986 | Shaffer | 437/1 |
| 4,738,749 | 4/1988 | Maurice et al. | 437/181 |
| 4,778,560 | 10/1988 | Takeda et al. | 437/181 |
| 4,790,630 | 12/1988 | Maurice | 437/181 |
| 4,889,411 | 12/1989 | Parks et al. | 350/334 |
| 4,929,059 | 5/1990 | Takahashi | 350/339 R |

FOREIGN PATENT DOCUMENTS

| 381927 | 8/1990 | European Pat. Off. |  |
| 1252335 | 10/1967 | Fed. Rep. of Germany . |  |
| 2013259 | 3/1990 | France . |  |
| 52-52381 | 4/1977 | Japan | 136/263 |
| 59-178669 | 2/1984 | Japan . |  |
| 59-63760 | 4/1984 | Japan . |  |
| 60-241021 | 11/1985 | Japan . |  |
| 61-163659 | 7/1986 | Japan . |  |
| 62-142367 | 6/1987 | Japan | 437/181 |
| 1-109328 | 4/1989 | Japan . |  |

OTHER PUBLICATIONS

Summary of Report presented at Prof. Osaka's seminar of Waseda University (Feb. 1990).
Murthy, et al., "preparation of polypyrrole in aqueous media", J. of Materials Science Letters, 3 (1984) pp. 745-747.
"A 9-Inch MIM-LCD" by Shinji Morozumi and Tadashi Ohta, vol. 40, No. 10, pp. 980(46) to 983(49) (1986).

Primary Examiner—Mary Wilczewski
Attorney, Agent, or Firm—Blum Kaplan

[57] ABSTRACT

A bidirectional nonlinear resistor for use as a nonlinear active element having a highly insulating organic film formed on a first conductor by polymerizing an electrolytic solution containing a supporting electrolyte and a soluble organic compound, and a conductor identical or not identical in kind with the first conductor formed on the organic film is provided. An active matrix substrate including a plurality of the bidirectional nonlinear resistor elements may be used to have a liquid crystal display panel.

8 Claims, 7 Drawing Sheets

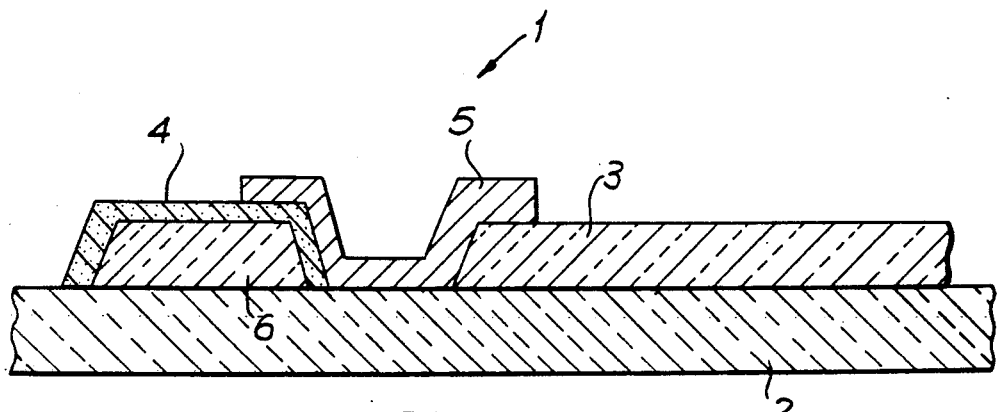
FIG. 1
PRIOR ART
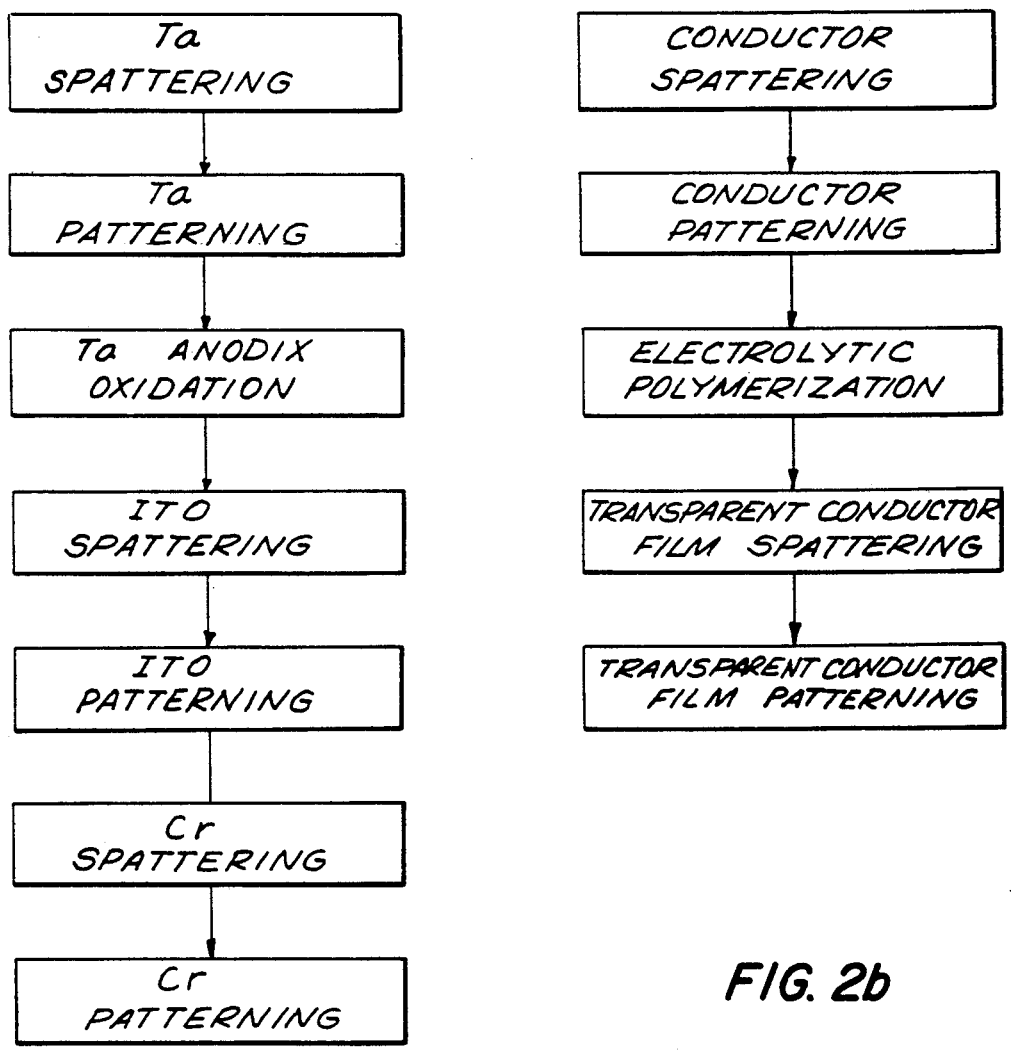
FIG. 2a PRIOR ART
FIG. 2b

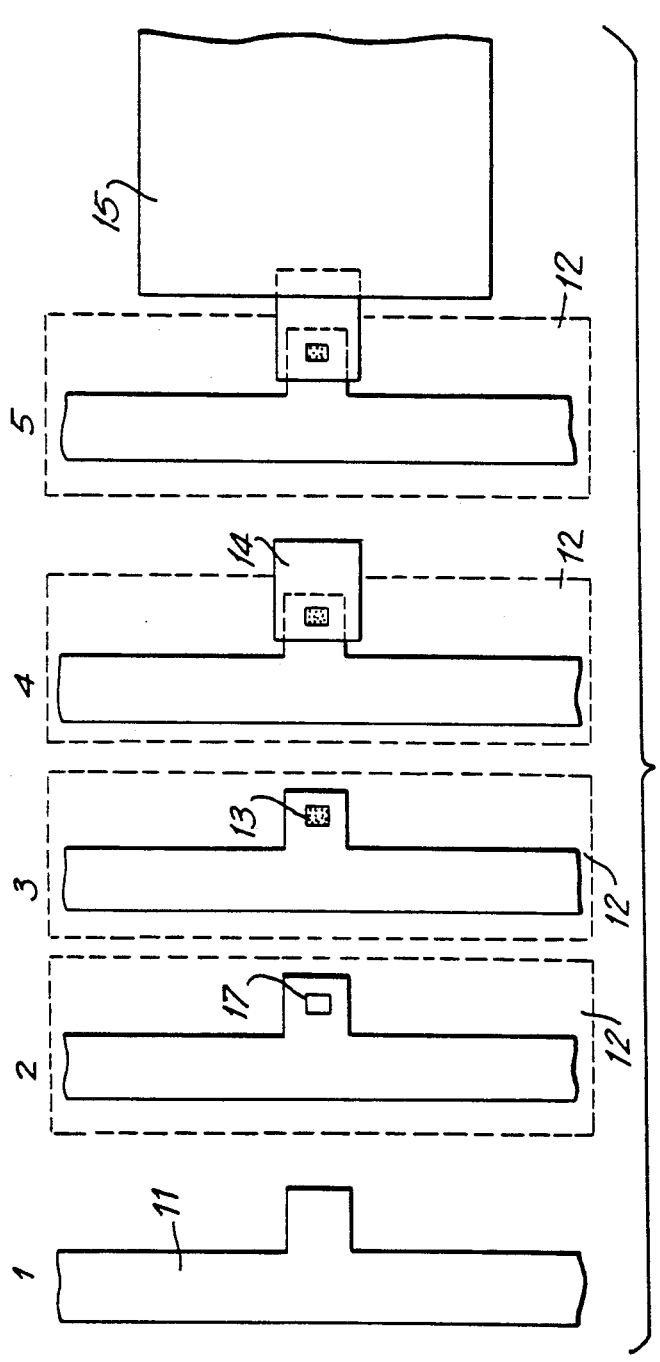
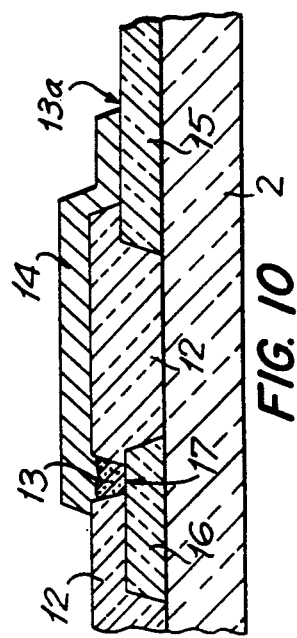
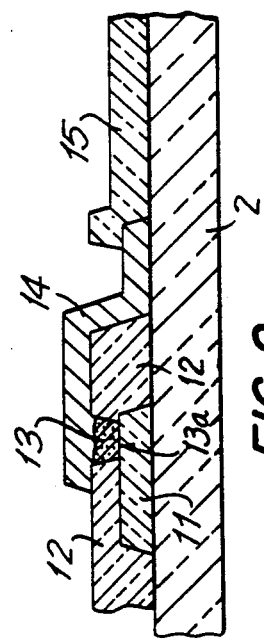

METHOD FOR PRODUCTION OF A BIDIRECTIONAL NONLINEAR RESISTOR, ACTIVE MATRIX LIQUID CRYSTAL PANEL USING BIDIRECTIONAL NONLINEAR RESISTOR

BACKGROUND OF THE INVENTION

This invention relates to a nonlinear resistor for all elements which require nonlinearity of resistance, and in particular, to a nonlinear resistor useful as an MIM (metal-insulator-metal) element functioning as a switching element in liquid crystal display devices, computer grade display devices or TV grade liquid crystal display devices.

The methods currently used for display of pictures in electro-optical displays, such as liquid crystal televisions are broadly classified as the simple matrix method and the active matrix method. The simple matrix method includes a liquid crystal interposed between two opposed, perpendicularly-intersecting sets of multiple ribbon-like electrodes. A drive circuit is connected to each of the ribbon-like electrodes. While the simple structure makes this method inexpensive, the resulting picture contrast is insufficient because of cross talk.

In contrast, the active matrix method utilizes switches which are adapted severally to serve individual picture elements and thus permits voltage retention. Because the selected voltage is retained even during the course of timeshared driving, the resulting large display capacity allows excellent picture qualities such as contrast The active matrix method nevertheless has a complicated structure and so the production cost is high. For example, in manufacturing thin film transistors (TFTs), using at least five photomasks to improve the yield for superposing five or six thin films is difficult. Accordingly, the two-terminal elements which allow improved yield and reduce production costs have been used in favor of other active elements.

The metal-insulator-metal element (MIM) is representative of these two-terminal elements The general structure and process for fabricating the MIM devices are shown in FIG. 1 and FIG. 2. The insulating films in conventional MIM elements have a lower electrode of $TaO_x$ formed by anodic oxidation. Since the specific dielectric constant is about 26, the element capacitance is as high as 0.1 pF when the size of the element is approximately 5 $\mu m \times 4$ $\mu m$ and the anodic oxide film thickness is approximately 600 Å. This element capacitance is as large as about ⅓ of the liquid crystal capacitance per picture element (200 $\times$ 200 $\mu m$).

Conventional MIM elements and the method of manufacture have three disadvantages. First, in a liquid crystal panel of this quality, voltages applied to the panel are not fully apportioned to the MIM element. Consequently, the switching property is inferior since the capacity ratio of the capacitance of the liquid crystal to the MIM element is about 3. As the result, the liquid crystal panel is inferior in display quality to the TFT panel.

The second disadvantage is that the MIM element side substrate is produced by a repeated photolitho-etching step, as noted in the process flow sheet of FIG. 2. While this repetition step simplifies the production process of the MIM element as compared with that of the TFT element, it nevertheless reduces the resulting yield.

The third disadvantage of conventional MIM elements is their production inefficiency because a vacuum device is repeatedly used in the formation of the film to avoid spattering.

Accordingly, it is desirable to provide a new MIM element and method of fabricating them which overcomes the problems of the prior art outlined above.

SUMMARY OF THE INVENTION

Generally speaking, in accordance with the invention, an improved bidirectional nonlinear resistor including a highly insulating organic film formed on a first conductor by an electrolytic polymerization of an electrolytic solution containing a supporting electrolyte and a soluble organic compound, and a second conductor which may be identical with the first conductor formed on the organic film.

In a method for producing an active matrix liquid crystal panel including the bidirectional nonlinear resistor an electrode of a designated pattern is formed on a first transparent substrate. highly insulating electrolytic polymer film is then formed on the electrode by electrolytic polymerization. A transparent electrode is formed on the entire surface of the transparent substrate and the transparent electrode is shaped in the designated pattern, thereby forming a conductor/insulator/conductor nonlinear resistor. To form an electro-optical display device, a second transparent substrate having formed transparent electrodes of a designated pattern for cooperating with the electrode on the first substrate is securely attached to the first active matrix substrate with a sealing material for receiving the electro-optical material.

Accordingly, it is an object of the invention to provide an improved bidirectional nonlinear resistor.

It is another object of the invention to provide an active matrix liquid crystal panel which includes a bidirectional nonlinear resistor.

It is a further object of the invention to provide an electro-optical display device including an active matrix substrate with a bidirectional nonlinear resistor as a switching element for providing picture quality comparable to that of a display including a TFT element.

Yet another object of the invention is to provide a bidirectional nonlinear resistor which can be produced inexpensively.

Yet a further object of the invention is to provide a method for producing active matrix liquid crystal panels including bidirectional nonlinear resistors in high yields.

Still other objects and advantages of the invention will, in part, be obvious and will, in part, be apparent from the specification.

The invention accordingly comprises the several steps and the relation of one or more of such steps with respect to each of the others, and the apparatus embodying features of construction, combination of elements and arrangement of parts which are adapted to effect such characteristics, all as exemplified in the following detailed disclosure, and the scope of the invention will be indicated in the claims.

BRIEF DESCRIPTION OF THE DRAWINGS

For a fuller understanding of the invention, reference is made to the following description taken in connection with the accompanying drawings, in which:

FIG. 1 is a sectional view of a conventional MIM element;

FIG. 2A is a flow diagram of the processing steps used to prepare the conventional active element;

FIG. 2B is a flow diagram of the processing steps used to prepare active element in accordance with the invention;

FIG. 9 is a cross-sectional view illustrating the two-terminal element of FIG. 8;

FIG. 10 is a cross-sectional view of another two-terminal element prepared in accordance with the processing steps of FIG. 8;

DETAILED DESCRIPTION OF THE PREFERRED EMBODIMENTS

Figure 4:
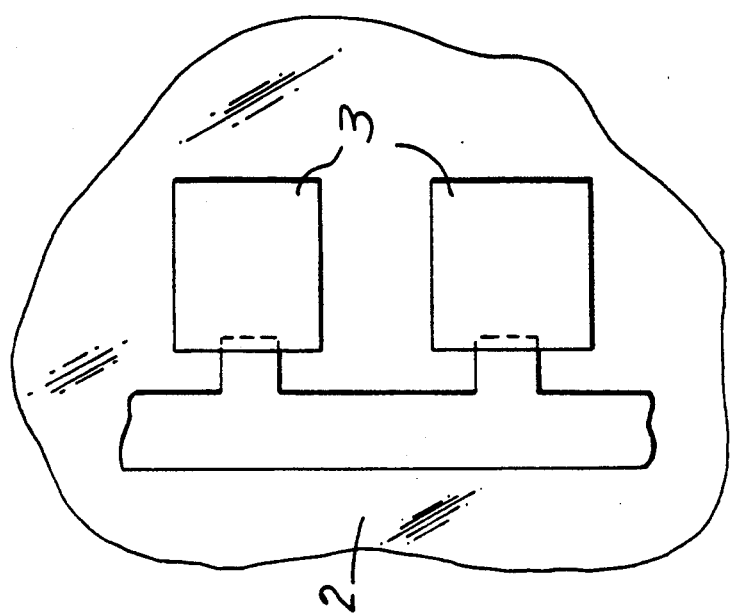
FIG. 4 is a top plan view of two picture elements of an active matrix prepared in accordance with the invention.

A MIM switching element 1 prepared in accordance with the prior art is shown in FIG. 1. MIM 1 includes a Ta wire 6 deposited on a glass substrate 2 and a $TaO_x$ insulator film 4 deposited on Ta wire 6. An ITO transparent electrode 3 is deposited adjacent to Ta wire 6 in a selective pattern and a Cr connector 5 is deposited to couple electrically ITO electrode 3 to MIM 1. The processing steps to form MIM 1 of FIG. 1 are set forth in the flow diagram of FIG. 2a.

Figure 3:
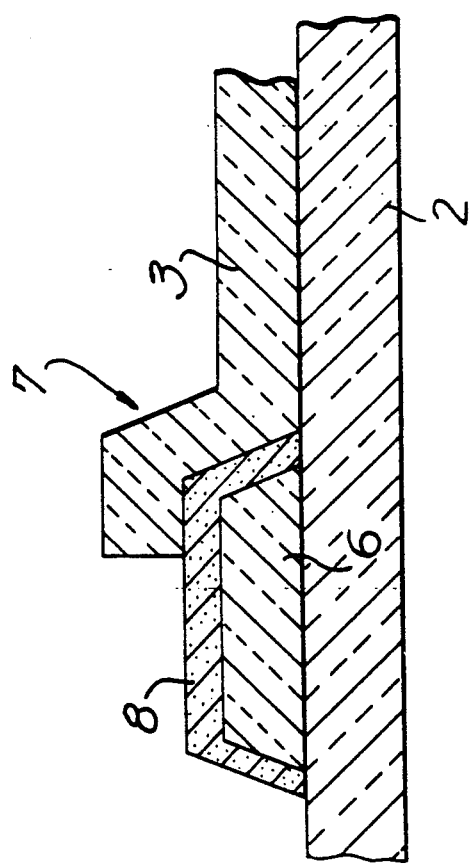
FIG. 3 is a sectional view of an active element prepared in accordance with the invention.

FIG. 3 illustrates the structure of a MIM 7 prepared in accordance with the processing steps in accordance with the invention as set forth in the flow diagram of FIG. 2b. A first conductive wiring 6 is deposited on substrate 2 and a highly insulating film 8 is deposited on conductive wiring 6. ITO electrode 3 is then selectively deposited on substrate 2 as in the device of FIG. 1.

A bidirectional nonlinear resistor in accordance with the invention is produced by forming a highly insulating organic film on a first conductor by electrolytic polymerization using an electrolytic solution containing at least a supporting electrolyte and an organic compound soluble in the electrolytic solution. A second conductor is formed on the organic film. The second conductor may be the same or a different material than the first conductor.

An active matrix panel including this bidirectional nonlinear resistor utilizes the bidirectional resistor as an active switching element for driving an electro-optical display device. The method for preparing the active matrix panel includes forming a first conductive wire in a designated pattern on a first transparent substrate, and forming a highly insulating electrolytic polymer film on the first conductive wire by electrolytic polymerization and forming a transparent electrode on the entire surface of the first substrate, shaping the transparent electrode into the designated pattern to form a conductor-/insulator/conductor nonlinear resistor. In a display device this active substrate is securely attached to a second transparent substrate with a sealing material which has cooperating transparent electrodes of a designated pattern for cooperating to drive the electro-optical material sealed in the space between the two substrates.

The electrolytic polymerization film has various physical properties, such as diode properties, which are already known in the art. The bidirectional nonlinear resistor is not known in the art. An element employing an electrolytic polymer film according to the invention provides bidirectional nonlinear resistivity, a character heretofore unknown in the art. Also provided is a method for the production of an active matrix panel using that bidirectional resistor as an active element.

The process to prepare the bidirectional resistor in accordance with the invention is as follows. First, a substance which will form a conductor is applied selectively to a transparent substrate. The conductor may be a transparent conductive film or semiconductor, of metals such as Au, Ag, Cu, Ni, Cr, and Ta, or alloys of such metals, or oxides such as $SnO_2$ and ITO. The methods which can be used to form the film include, but are not limited to, spattering, vacuum evaporation, CVD, and plating. The conductor thus formed on the transparent substrate is shaped into the designated pattern by photolithoetching.

Second, a highly insulating organic film is formed on the conductor by electrolytic polymerization. The electrolytic polymerization solution contains at least a monomer to be polymerized and a supporting electrolyte. The solution also contains a solvent capable of dissolving both the monomer and the supporting electrolyte. Solvents which may be used include, but are not limited to, water, alcohols, acetonitrile and propylene carbonates.

Monomers which can be used for the electrolytic polymerization include, but are not limited to, aromatic compounds such as aniline and phenol which contain an amino group and a hydroxyl group, respectively, on a benzene ring. Heterocyclic compounds, such as pyrrole and thiophene, polycyclic hydrocarbons such as azulene and pyrene which include two or more condensed aromatic rings, and organic compounds including an unsaturated bond may also be used.

The supporting electrolyte is capable of imparting ample electroconductivity to the electrolytic solution. Supporting electrolytes which may be used include, but are not limited to, $NaClO_4$, $LiClO_4$, $NaBF_4$, $NaOH$, $H_2SO_4$, and $Na_2SO_4$, for example. This supporting electrolyte is incorporated in the electrolytic solution in a concentration in the range of 0.1 to 1 mol/liter.

The methods of electrolysis which are available for the polymerization of the organic substance include, but are not limited to, the potential sweeping electrolytic method, the constant potential electrolytic method, the constant current electrolytic method, and the AC electrolytic method.

Different methods are available for the formation of the highly insulating organic film in the present invention.

A first method includes forming the organic film by electrolytic polymerization and subsequently depriving the film of ions. This removal of ions from the organic film can be attained by applying a potential of reverse polarity to the electrolytic solution in which the organic film has been formed by electrolytic polymerization.

A second method involves forming an electrochemically inactive film, which can be accomplished by suitably combining the composition of the electrolytic solution, the conditions of electrolysis, the materials of electrodes, and the like. For example, a phenol or a derivative thereof produces an electrochemically-inactive film when electrolytically oxidized with carbon electrodes in an acetonitrile solution (a supporting electrolyte: $NaClO_2$). It also forms an inactive polyphenylene oxide film when it is subjected to electrolytic oxidation in basic methanol 1,2-Diaminobenzene forms an electrochemically inactive film when electrolyzed in a neutral solution.

In a particularly preferred embodiment, the organic film produced has a thickness in the range of 100 Å to 2 $\mu$m. If the thickness is less than 100 Å, the organic film is so porous as to induce ready formation of a short circuit between the conductors opposed to each other across the organic film. If the thickness exceeds 2 $\mu$m, the resulting bidirectional nonlinear resistor offers too high resistance in spite of the nonlinearity thereof for the bidirectional nonlinear resistor to be utilized effectively as an active element for a liquid crystal panel.

A metallic film of a designated pattern is formed on the organic insulator as described above to yield a conductor/insulator/conductor nonlinear resistor (two-terminal element) The second conductor may be formed by the technique of sputtering, vacuum evaporation, or CVD with a compound based on a metal such as Au, Ag, Cu, Pt, Ni, Co, Cr, Fe, Ta, or Ti or a metal oxide such as $SnO_2$, $In_2O_3$, ZnO, CdO, ZnS, CdS, or $CdSnO_4$.

Three methods other than the basic method described above are available for the formation of the active element suitable for use in producing an active matrix liquid crystal panel in accordance with the invention. The first method, as illustrated in FIG. 5, includes a first step of forming a first conductor layer 11 of a designated pattern on a first transparent substrate 10, a second step of forming a highly insulating electrolytic polymer film 13 on electrode 11 by electrolytic polymerization, a third step of forming a second conductor 14 identical or not with first conductor 11 into the designated pattern, thereby forming a conductor/insulator/conductor nonlinear resistor, and a fourth step of forming a picture element 15 with the transparent conductor film in the shapes illustrated in FIG. 5 and in cross-section in FIG. 6.

Figure 7:
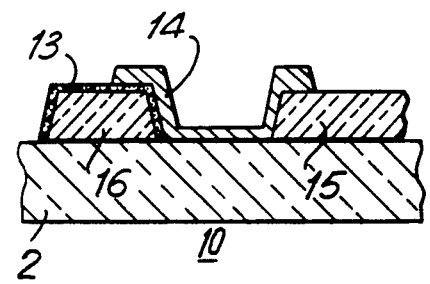
FIG. 7 is a cross-sectional view of a two-terminal element prepared in accordance with another embodiment of the process of FIG. 8 illustrates the steps to prepare a two-terminal element in accordance with the invention.
Figure 11:
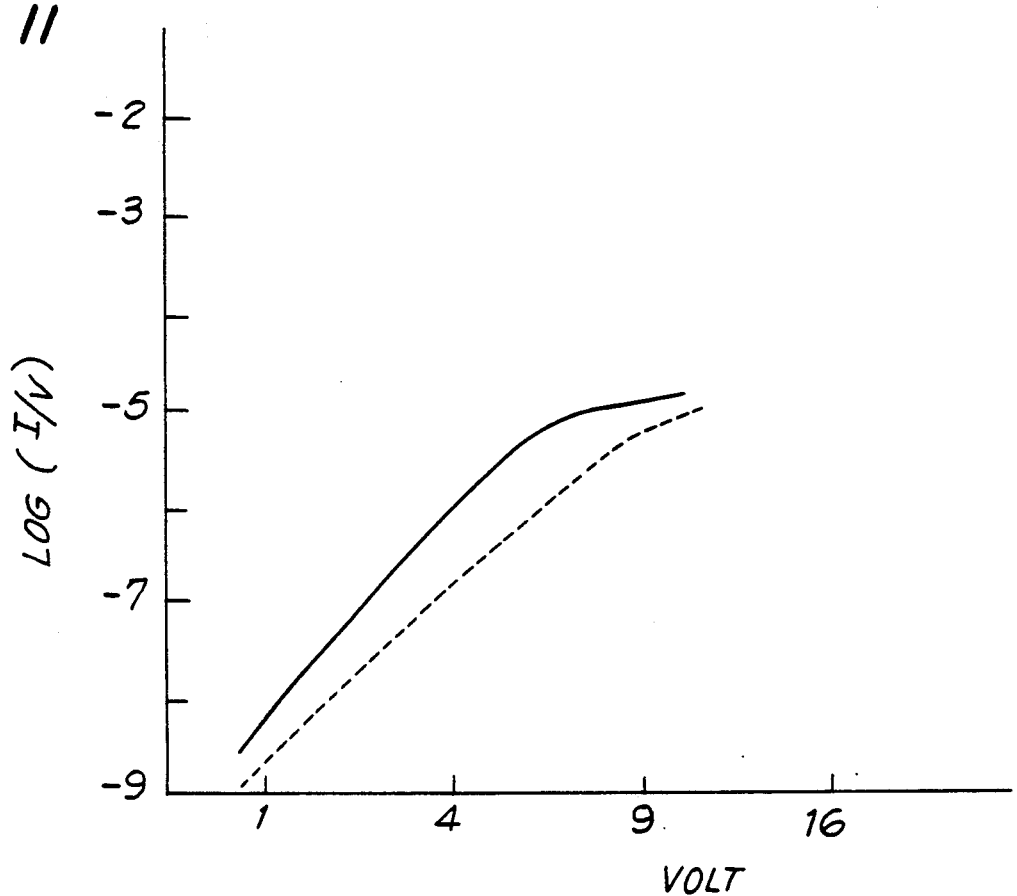
FIG. 11 is an I/V characteristic diagram of an MIM element prepared in accordance with Example 1.
Figure 12:
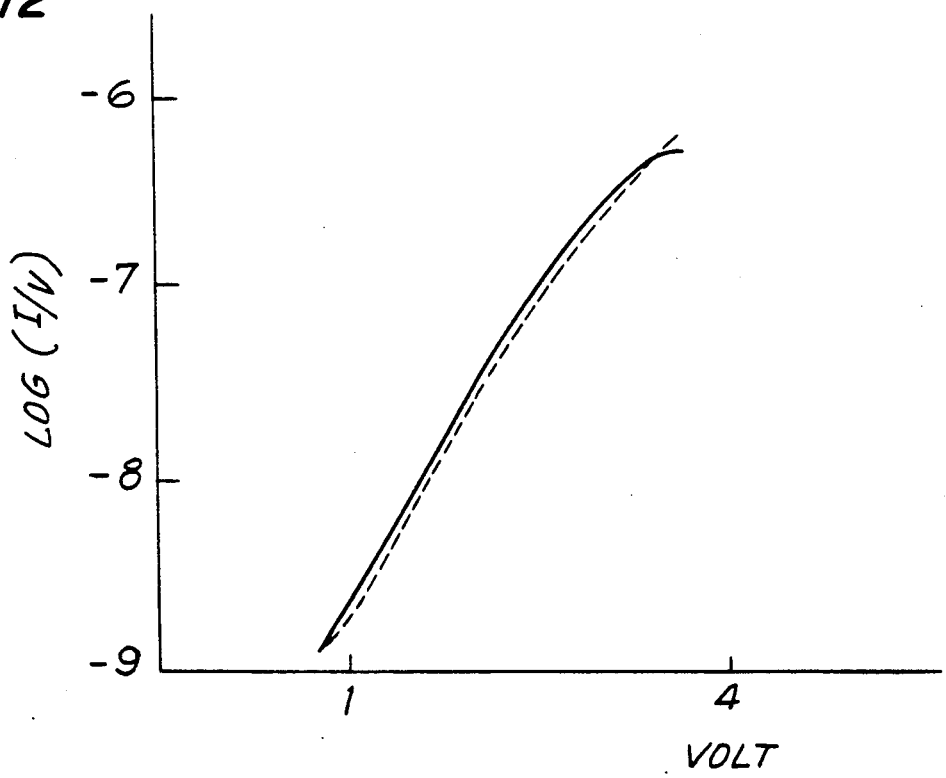
FIG. 12 is an I/V characteristic diagram of MIM element prepared in accordance with Example 2.
Figure 13:
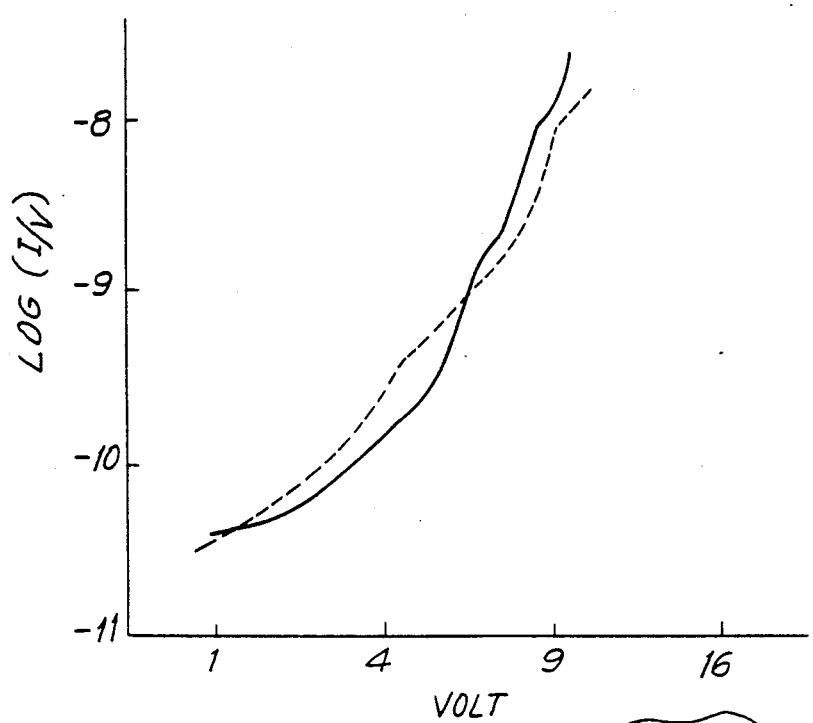
FIG. 13 is an I/V characteristic diagram of an MIM element prepared in accordance with Example 3.

Optionally, the picture element 15 is deposited before second conductor 14 to yield the cross-sectional shape of FIG. 7 when the first and fourth steps are carried out simultaneously.

Figure 5:
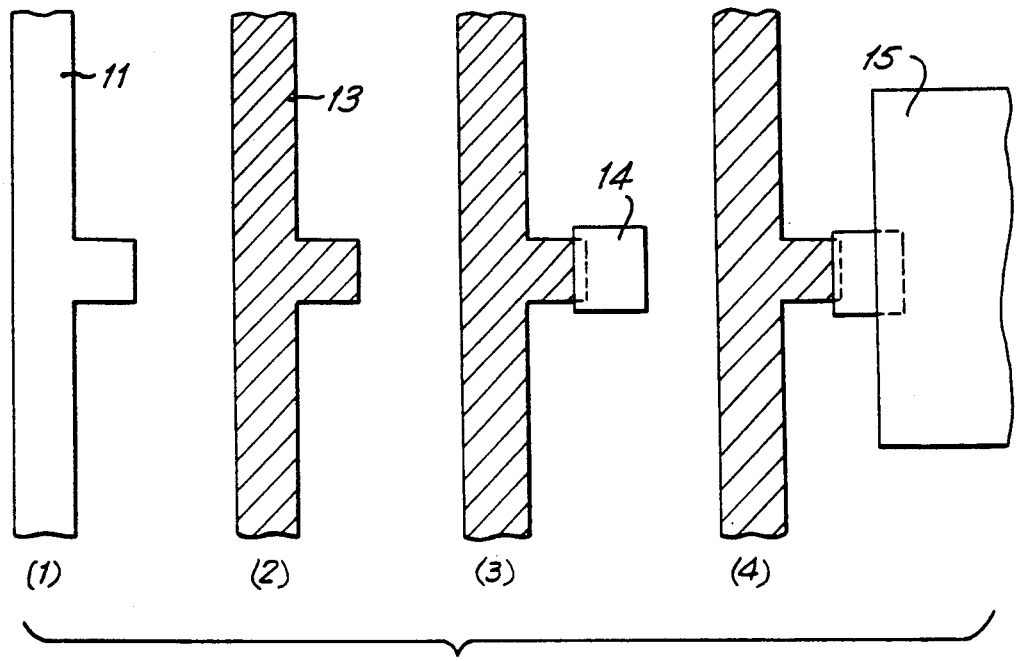
FIG. 5 illustrates the steps to prepare a two-terminal element in accordance with the invention.
Figure 6:
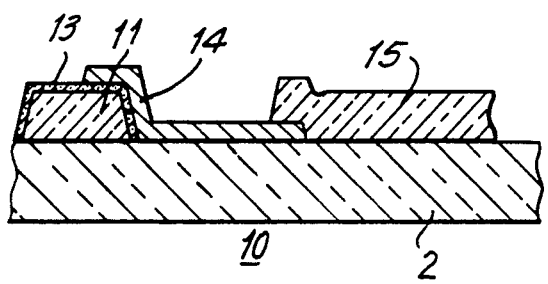
FIG. 6 is a cross-sectional view of a two-terminal element prepared in accordance with the processing steps of FIG. 5.

FIGS. 6 and 7 are cross-sectional views of active elements formed by the process shown in FIG. 5. The reference numerals 1 [to 15 found in FIG. 6 correspond to like reference numerals found in FIG. 5. The reference numeral 16 found in FIG. 7 denotes what is produced by first forming first conductor layer 16 and picture elements 15 with the transparent conductor, forming electrolytic polymer film 13 only on conductor layer 16, and thereafter forming second conductor 14 identical or not in composition to first conductor layer 16 in the designated pattern.

A second method to prepare the active element in accordance with the invention includes a first step of forming on a first transparent substrate 2 an electrode 11 of a designated pattern as illustrated in FIG. 9, a second step of forming transparent insulating film 12 either on the entire surface of transparent substrate 2 or only on electrode 11 and forming in the designated part of insulator film 12 a contact hole 13a communicating with the electrode, a third step of forming an electrolytic polymer film 13 on electrode 11 through contact hole 13a by electrolytic polymerization, a fourth step of forming conductor 14 into the designated pattern thereby forming a conductor/insulator/conductor nonlinear resistor, and a fifth step of forming picture element 15 with a transparent conductor film in the shape illustrated in FIG. 8.

Optionally, the active element and the picture element having the cross-sectional shape shown in FIG. 10 may be obtained by simultaneously carrying out the first and fifth steps and forming contact holes 13a on first electrode 11 and on picture element 15 in the second step.

FIGS. 9 and 10 are cross-sectional views of active elements formed by the process illustrated in FIG. 8. Reference numerals 11 to 15 in FIG. 9 correspond to like reference numerals in FIG. 8.

The active element of FIG. 10 is produced by first forming simultaneously a first electrode 16 and picture element 15 with transparent conductor 14, then forming insulator film 12, subsequently forming a contact hole 17 through insulator 12, depositing electrolytic polymer film 13 in contact hole 17, and thereafter forming conductor 14.

In this process, transparent insulator film 12 coats substrate 2 after first conductor 16 is formed in the designated pattern. In the designated position of insulator film 12, contact hole 17 is formed so as to communicate with first conductor layer 16 [FIG. 8]. The coating with insulator layer 12 may be effected on the entire surface or on part of the surface as illustrated in FIGS. 9 and 10.

Materials which may be used for transparent insulator film 14 include, but are not limited to, epoxy resin, acryl resin, polyimide resin, polyamide resin, polyvinyl resin, nylon resin, polyester resin, acetate resin, phenoxy resin and the like. Optionally, the insulator film may be formed by subjecting an organic metal compound to dehydrocondensation. Organic compounds which may be used include, but are not limited to, those including silicon, titanium, tantalum, chromium, aluminum, indium, tungsten, molybdenum, zirconium, and germanium, as central metals.

The insulator film may be a thermosetting type or an ultraviolet-setting type. The insulator film can be formed by the offset printing, the flexiso printing, or the screen printing. Optionally, the contact hole may be formed by the photolithoetching technique after the insulator film is formed on the entire surface. Thereafter, the process is the same as first method.

In a third method in accordance with the invention, alternatively to the second method described above, a transparent conductor film may be formed as the conductor in the fourth step as illustrated in FIG. 5, and the conductor/insulator/conductor nonlinear resistor and the picture element may be simultaneously formed.

The invention will be described more specifically in the following examples which are set forth for purposes of illustration only and not in a limiting sense.

EXAMPLE 1

An electrolytic polymerization solution was prepared using a solution containing 0.1 mol of N-methyl pyrolle and 0.5 ml of sodium perchlorate per liter of propylene carbonate solvent. An ITO (indium-tin oxide) electrode for the formation of a nonlinear resistor was formed by vacuum evaporation on a glass substrate. The ITO electrode was covered using a photoresist, except for a hole 300 μm in diameter and a contact part intended for contact with an external electrode.

The propylene carbonate solution was electrolytically polymerized by using the ITO electrode as a test electrode, a platinum electrode as a counter electrode, and a silver oxide electrode as a reference electrode. Specifically, constant potential polymerization was performed at +0.9V at the reference electrode to form a poly-N-methyl pyrrole film 5,000 Å in thickness. Dopant was then thoroughly removed at −0.4V at the reference electrode. The result of this electrolytic polymerization was the conversion of the electrolytic polymer film into an insulator film.

An ITO film was superposed by spattering onto the electrolytic polymer film. The resulting MIM element was tested for I-V characteristics, and the results are shown in the graph in FIG. 6. The broken lines represent data obtained when the underlying electrode on the substrate side had negative polarity and the continuous lines represent data obtained when the same electrodes had positive polarity. As is clearly noted from the graph, the MIM element is bidirectionally nonlinear, irrespective of the polarity of the substrate electrode.

EXAMPLE 2

An electrolytic solution of 0.2 Mol of pyrrole and 0.2 mol of lithium perchlorate per liter of propylene carbonate was prepared. Except for a different electrolytic solution, an MIM element was formed by following the procedure of Example 1. Again, the electrolysis was performed at a constant current.

The I-V characteristic curve for the MIM element is shown in FIG. 7. As is clearly noted from the graph, the MIM element is bidirectionally nonlinear, irrespective of the polarity of the substratal electrode.

EXAMPLE 3

An electrolytic solution was prepared by dissolving 0.05 mol of 2,6-dimethyl phenol and 0.3 mol of sodium hydroxide per liter of methanol. An ITO electrode was formed by following the procedure of Example 1 except the electrolytic solution was subjected to constant potential electrolysis at +2.2V. The time at which the electric current ceased to flow was taken as the end point of the electrolysis. An ITO film was sputtered onto the electrolytic polymer film thus obtained. The resulting MIM element was tested for I-V characteristics, and the results are shown in the graph in FIG. 8. As is clearly noted from the graph, the MIM element is bidirectionally nonlinear, irrespective of the polarity of the substratal electrode.

EXAMPLE 4

The electrolytic solution was obtained by dissolving 0.05 mol of phenol and 0.3 mol of sodium hydroxide per liter of methanol. A MIM element was formed by following the procedure of Example 3 and tested for I-V characteristics. As in the other examples, a bidirectional nonlinear resistance was obtained.

EXAMPLE 5

An element having a poly-N-methyl pyrrole layer 1 μm in thickness deposited on an ITO electrode was formed and tested for the I-V characteristics by following the procedure of Example 1. As in Example 1, a nonlinear resistor was obtained.

EXAMPLE 6

An ITO (indium-tin oxide) film measuring 1,500 Å in thickness and provided with multiple ribbon electrode patterns was formed on a glass substrate by spattering.

An electrolytic polymerization solution containing 0.1 mol of N-methyl pyrrole and 0.5 mol of lithium perchlorate per liter propylene carbonate solvent was prepared and subjected to bubbling nitrogen gas. A platinum plate was used as a counter electrode and a silver oxide electrode as a reference electrode. The electrolytic polymerization solution, with the aforementioned ITO-deposited glass substrate immersed therein, was subjected to electrolytic polymerization at a constant potential of +1.0V for 15 minutes to superpose a poly-N-methyl pyrrole film 4,000 Å in thickness onto the ITO film. Dope was then removed by electrolysis at −0.8V until the electric current decreased to 0.

Figure 14:
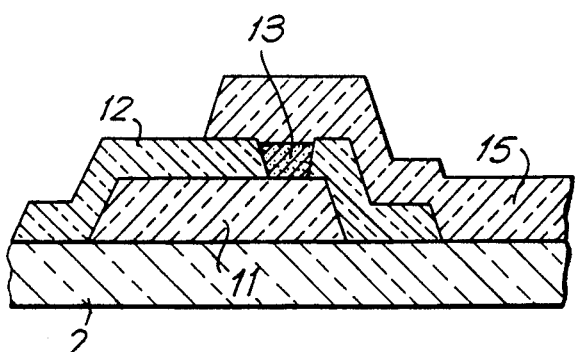
FIG. 14 is a cross-sectional view of an active element prepared in accordance with another embodiment of the invention.
Figure 15:
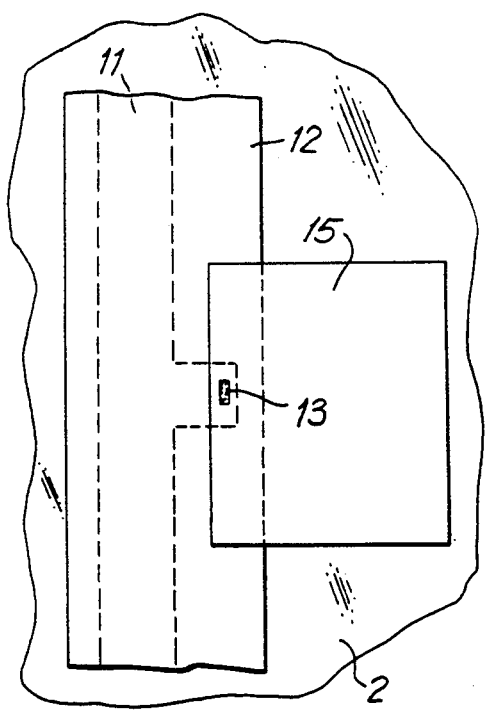
FIG. 15 is a plan view of the active element and picture electrode of FIG. 14.
Figure 16:
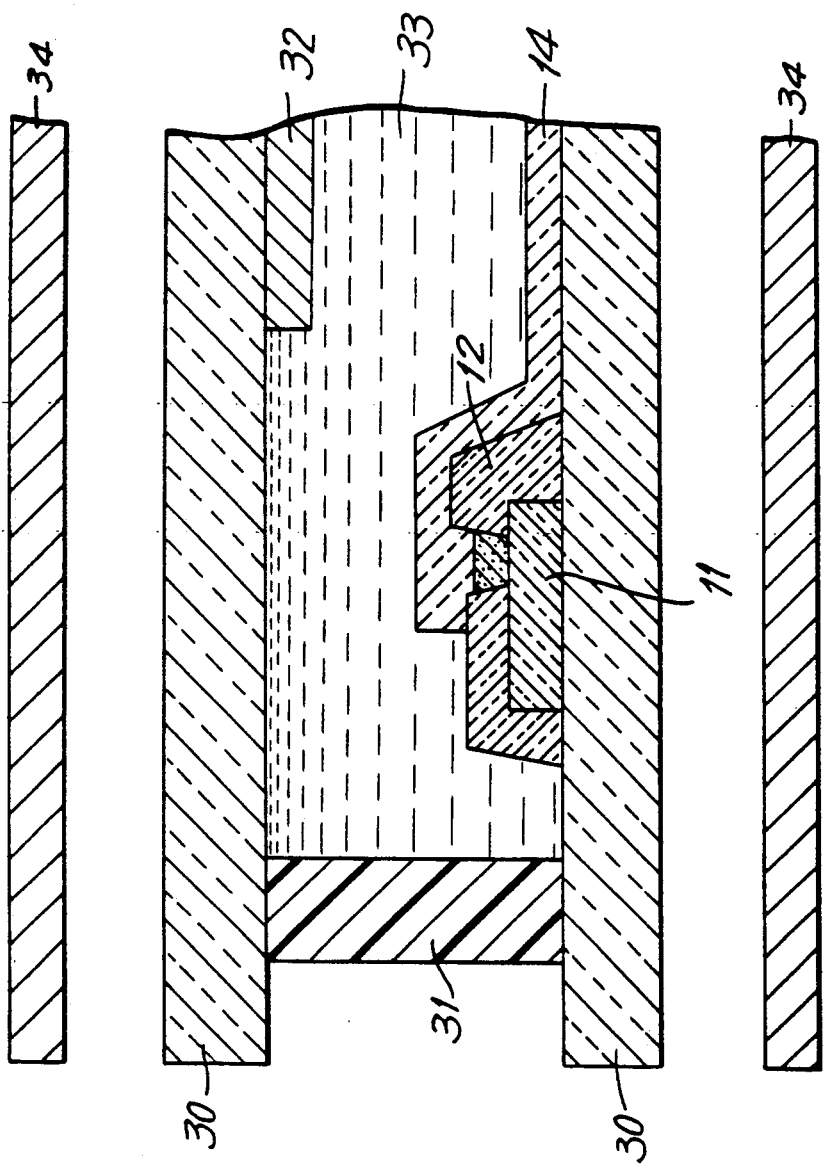
FIG. 16 is a cross-sectional view of a liquid crystal panel including a bidirectional nonlinear resistor in accordance with the invention.

The composite element was washed with purified water and dried at 120° C. An ITO film was formed in a thickness of 500 Å on the entire surface of the glass substrate by spattering. The ITO film was patterned by photolitho-etching into the shape of the element shown in FIGS. 14 and 15 to produce an element at the designated position on the multiple ribbon electrodes.

A second glass substrate was prepared as a counter substrate by depositing multiple rows of ITO electrodes thereon. The first and second substrates were secured together by a spacer to form a liquid crystal panel.

This liquid crystal panel was driven with the same drive circuit as used for a conventional MIM panel to determine contrast. It was found that the panel produced herein had better contrast than the conventional panel. The improved contrast occurs because poly-N-methyl pyrrole film has a smaller specific dielectric constant and a larger film thickness than $TaO_x$ film.

EXAMPLE 7

An electrolytic solution was prepared by dissolving 0.05 mol of 2,6-dimethyl phenol and 0.3 mol of sodium hydroxide per liter of methanol. Thereafter, an ITO electrode on a glass substrate was subjected to constant potential electrolysis at +2.2V to form an electrolytic polymer film. The time at which the electric current decreased to 0 was taken as the end point of the electrolysis.

An active matrix liquid crystal panel was produced by following the procedure of Example 6. In the comparative test performed in the same manner as in Example 6, the panel was found to have better contrast than the conventional MIM panel.

EXAMPLE 8

An active matrix liquid crystal panel was produced by following the procedure of Example 6, except the thickness of the electrolytic polymer film was increased to 1,000 Å. The results were the same as in Example 6.

EXAMPLE 9

A Ta film with multiple ribbon electrode patterns was formed on a glass substrate in a thickness of 1,500 Å by spattering.

An electrolytic polymerization solution containing 0.1 mol of N-methyl pyrrole and 0.5 mol of lithium perchlorate per liter of propylene carbonate was prepared and subjected to bubbling nitrogen gas. A platinum plate was used as a counter electrode and a silver oxide electrode as a reference electrode. The electrolytic polymerization solution, with the Ta-deposited glass substrate immersed therein, was subjected to electrolytic polymerization at a constant voltage of +0.1V for 15 minutes to superpose a poly-N-methyl pyrrole film about 4,000 Å in thickness on the Ta film. The dope was then removed by electrolysis at −0.8 V until the electric current decreased to 0.

Thereafter, the resulting composite element was washed with purified water and dried at 120° C. A Cr alloy film was formed in a thickness of 500 Å on the entire surface of the glass substrate by spattering.

This Cr alloy film was patterned by photolitho-etching into the shape of the element shown in FIGS. 5 and 6 to produce an element at the designated position on the multiple ribbon electrodes.

An ITO (indium-tin oxide) film was then formed on the element in a thickness of 500 Å in the shape shown in FIG. 4a and 4b by spattering and photolitho-etching.

A second glass substrate was prepared as an opposed substrate by depositing multiple rows of ITO electrodes thereon. The first and second substrates were securely attached by a spacer to form a liquid crystal panel, thereby producing an active matrix liquid crystal panel.

This liquid crystal panel was driven with the same drive circuit as used for a conventional MIM panel to determine contrast. It was found that the panel produced herein had better contrast than the conventional panel. The improved contrast occurs because poly-N-methyl pyrrole film has a smaller specific dielectric constant and a larger film thickness than TaOx film.

EXAMPLE 10

An electrolytic solution was obtained by dissolving 0.05 mol of 2,6-dimethyl phenol and 0.3 mol of sodium hydroxide per liter of methanol. Thereafter, an ITO electrode on a glass substrate was subjected to constant potential electrolysis at +2.2V to form an electrolytic polymer film by following the procedure of Example 9. The time at which the electric current decreased to 0 was taken as the end point of the electrolysis.

An active matrix liquid crystal panel was produced by following the procedure of Example 9 and compared with the conventional MIM panel. The panel of this example wa found to have better contrast than the conventional panel.

EXAMPLE 11

An ITO (indium-tin oxide) film measuring 2,000 Å in thickness in a multiple ribbon electrode pattern was formed on a glass substrate by spattering.

An electrolytic polymerization solution containing 0.1 mol of N-methyl pyrrole and 0.5 mol of lithium perchlorate per each liter polypropylene carbonate was prepared and subjected to bubbling nitrogen gas. A platinum plate was used as a counter electrode and a silver oxide electrode as a reference electrode. The ITO-deposited glass substrate was immersed in the polymerization solution and subjected to electrolytic polymerization at a constant potential of +1.0V for 15 minutes to form a poly-N-methyl pyrrole film in a thickness of about 4,000 Å on the ITO. Dope was then removed by electrolysis at −0.8V.

The resulting component element was washed with purified water and dried at 120° C. A Cr alloy film was formed in a thickness of 500 Å on the entire surface of the glass substrate by spattering.

This Cr alloy film was patterned by photolitho-etching into the shape of the element shown in FIGS. 5 and 6 to yield an element at the designated position on the multiple ribbon electrodes. This element yielded the same improved contrast in the resulting liquid crystal panel as in Example 6.

EXAMPLE 12

A Ta film measuring 1,500 Å in thickness in a multiple ribbon electrode pattern was formed on a glass substrate by spattering.

An epoxy acrylate resin (produced by Okuno Seiyaku K.K. and marketed under the trademark "SO Clear") was superposed on the Ta film by spin coating, resulting in a transparent insulator film 2 μm in thickness. This transparent film was exposed to ultraviolet light through a photomask of a designated pattern. A 10 μm-diameter contact hole intended for contact with the ITO electrode was thereby formed Next, an electrolytic polymerization solution containing 0.1 mol of N-methyl pyrrole and 0.5 mol of lithium perchlorate per liter propylene carbonate was prepared and subjected to bubbling nitrogen gas. A platinum plate was used as a counter electrode and a silver oxide electrode as a reference electrode. The electrolytic polymerization solution, with the aforementioned Ta-deposited glass substrate immersed therein, was subjected to electrolytic polymerization at a constant potential of +1.0V for 15 minutes to form a poly-N-methyl pyrrole film about 4,000 Å in thickness on the ITO Dope was then removed by electrolysis at −0.8V until the electric current decreased to 0.

The composite element was washed with purified water and dried at 120° C. A Cr film was formed in a thickness of 500 Å on the entire surface of the glass substrate by spattering.

This Cr film was patterned by photolitho-etching into the shape of the element shown in FIG. 8 to yield an element at the designated position on the multiple ribbon electrodes. An ITO (indium-tin oxide) film 500 thick was formed on this element by spattering and photolitho-etching int eh shape shown in FIG. 5a and 5b.

A second glass substrate was prepared as a counter substrate by depositing multiple rows of ITO electrodes thereon. The first and second substrates were securely attached by a spacer to form an active matrix liquid crystal panel.

This liquid crystal panel was driven with the same drive circuit as used for a conventional MIM panel to determine contrast. It was found that the panel produced herein had improved contrast compared to the conventional panel. The improved contrast occurs because poly-N-methyl pyrrole film has a smaller specific dielectric constant and a larger thickness than a $TaO_x$ film.

EXAMPLE 13

An electrolytic solution was prepared by dissolving 0.05 mol of 2,6-dimethyl phenol and 0.3 mol of sodium hydroxide per liter of methanol. Thereafter, a Ta electrode disposed on a glass substrate was subjected to constant potential electrolysis at +2.2 V by following the procedure of Example 1 to form an electrolytic polymer film. The time at which the electric current decreased to 0 was taken as the end point of the electrolysis.

An active matrix liquid crystal panel was produced by following the procedure of Example 12. This panel was found to have better contrast then the conventional MIM panel.

EXAMPLE 14

An ITO (indium-tin oxide) film in a multiple ribbon electrode pattern and a picture element pattern was formed on a glass substrate in a thickness of 2,000 by spattering. Thereafter, an insulator film and a contact hole were formed by following the procedure of Example 1.

An electrolytic polymerization solution containing 0.1 mol of N-methyl pyrrole and 0.5 mol of lithium perchlorate per liter propylene carbonate was prepared and subjected to bubbling nitrogen gas. A platinum plate was used as a counter electrode and a silver oxide electrode was used as a reference electrode. The electrolytic polymerization solution, with the ITO-deposited glass substrate immersed therein, was subjected to electrolytic polymerization at a constant potential of +1.0V for 15 minutes to form a poly-N-methyl pyrrole film 4,000 Å in thickness through a contact hole on the ITO film. The dope was then removed by electrolysis at −0.8V until the electric current decreased to 0.

Thereafter, the completed composite element was washed with purified water and dried at 120° C. A Cr alloy film was formed in a thickness of 500 Å on the entire surface of the glass substrate by spattering. This Cr alloy film was patterned by photolithoetching into the shape of the element shown in FIG. 8 to form an element at the designated position on the multiple ribbon electrodes.

Thereafter, an active matrix liquid crystal panel was prepared by following the procedure of Example 12 using the aforementioned substrate. This panel yielded the same improved contrast as in Example 12.

EXAMPLE 15

An ITO (indium-tin oxide) film measuring 1,500 in thickness in a multiple ribbon electrode pattern was formed on a glass substrate by spattering.

An epoxy acrylate resin (produced by Okuno Seiyaku K.K. and marketed under the trademark "SO Clear") was superposed on the ITO film by spin coating, resulting in a clear insulator film 2 μm in thickness This insulator film was exposed to ultraviolet light through a photomask of a designated pattern. A 10 μm-diameter contact hole intended for contact with the ITO electrode was thereby formed.

Next, an electrolytic polymerization solution containing 0.1 mol of N-methyl pyrrole and 0.5 mol of lithium perchlorate per liter of propylene carbonate was prepared and subjected to bubbling nitrogen gas. A platinum plate was used as a counter electrode and a silver oxide electrode as a reference electrode. The electrolytic polymerization solution, with the Ta-deposited glass substrate immersed therein, was subjected to electrolytic polymerization at a constant potential of +1.0V for 15 minutes to form a poly-N-methyl pyrrole film about 4,000 Å in thickness on the ITO. Dope was then removed by electrolysis at −0.8V until the electric current decreased to 0.

The composite element was washed with purified water and dried at 120° C. An ITO film was formed in a thickness of 500 Å on the entire surface of the glass substrate by spattering. This ITO film was patterned by photolitho-etching into the shape of the element shown in FIGS. 14 and 15 to yield an element at the designated position on the multiple ribbon electrodes.

A second glass substrate was prepared as an opposed substrate by depositing multiple rows of ITO electrodes thereon. The first and second substrates were securely attached by a spacer to yield a active matrix liquid crystal panel.

This liquid crystal panel was driven with the same drive circuit as used for a conventional MIM panel to determine contrast. It was found that the panel produced herein had better contrast than the conventional panel. The improved contrast occurs because poly-N-methyl pyrrole film has a smaller specific dielectric constant and a larger thickness than TaO film.

EXAMPLE 16

An active matrix element was produced by following the procedure of Example 15.

An electrolytic solution containing 0.05 mol of 2,6-dimethyl phenol and 0.3 mol of sodium hydroxide per liter of methanol was subjected to electrolysis at a constant potential of +2.2V to form an electrolytic polymer film. The time at which the electric current decreased to 0 was taken as the end point of the electrolysis.

Thereafter, an active matrix panel was produced by following the procedure of Example 15. This panel was found to have better contrast than the conventional MIM panel.

EXAMPLE 17

An active matrix liquid crystal panel was produced by following the procedure of Example 15 to form an electrolytic polymer film in a thickness of 1,000 Å. The panel yielded the superior contrast as in Example 15.

EXAMPLE 18

On a 0.9 mm thick glass substrate (produced by Corning Corp. under the trademark "Pyrex 7059"), an ITO film 1,500 Å thick was formed by spattering. This ITO film was etched in a designated pattern by the photolitho process to form wiring 35 μm in width. An epoxy acrylate resin (produced by Okuno Seiyaku K.K. the trademark "SO Clear") was superposed on this wiring in a thickness of 3 μm by spin coating and then shaped into a designated pattern by the photolitho process. This pattern had 18 μm-diameter contact holes spaced at fixed intervals on the wiring.

Next, an electrolytic polymer film 5,000 Å thick of poly-N-methyl pyrrole was formed on the ITO film through the contact holes (not shown in the diagram) disposed in the electrolytic polymer film under the conditions described for Example 1. An ITO film was formed on this substrate with a thickness of 600 Å by spattering. The ITO film was etched in a designated pattern by the photolitho process to obtain a picture element electrode measuring 170 μm in its side length and to form an MIM element part.

On an opposed glass counter substrate 0.9 mm in thickness (produced by Corning Corp. under the trademark "Pyrex 7059"), a 1,500 Å thick ITO film was formed by spattering. This ITO film was formed in a designated pattern of a wire and a pair of picture element electrodes.

The two substrates (MIM element substrate and counter substrate) obtained as described above were dipped in an aqueous 0.1% amino silane solution (produced by Nippon Soda Co., Ltd. as product code "SH6020"), washed, fired at 180° C., and then subjected to an orienting treatment by rubbing.

The MIM element substrate and the counter substrate were securely attached to each other by using a thermosetting type epoxy resin as a sealing agent containing glass fibers 6 μm in diameter as a cell gap retaining material. Keeping the two substrates pressed against each other for three hours at 150° C., a liquid crystal cell possessing an MIM element was obtained.

The liquid crystal cell was filled with liquid crystal and tightly sealed by vacuum sealing. The liquid crystal used was a PCH (phenyl cyclohexane) type liquid crystal (produced by Merck under product code "ZLI-1695"). A liquid crystal display panel (QCD) was completed by securing a polarizing sheet to the upper and lower surfaces of the liquid crystal cell.

When this liquid crystal display panel was operated with the same circuit as used for a conventional MIM panel, it exhibited good display properties at 1/480 duty.

Specific advantages of the active matrix liquid crystal panel of this invention as described include a picture quality comparable to that of the TFT element, and a bidirectional nonlinear resistor which may be produced inexpensively in high yield.

It will thus be seen that the objects set forth above, among those made apparent from the preceding description, are efficiently attained, and certain changes may be made in the above construction and steps without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A method for preparation of an active matrix substrate comprising:
   (a) forming a first electrode in a designated pattern of parallel rows on a first transparent substrate;
   (b) depositing a transparent insulating film on at least the entire exposed surface of the first electrode;
   (c) forming a contact hole in the insulating film to the electrode;
   (d) depositing an electrolytic polymer film through the contact hole on the electrode by electrolytic polymerization;
   (e) depositing picture elements on a portion of the first transparent substrate; and
   (f) depositing a conductor in a designated pattern on at least a portion of the electrolytic polymer film with at least a portion thereof opposed to a portion of the first electrode with the electrolytic polymer film therebetween to form a conductor-insulator-conductor structure which functions as a nonlinear resistor, and with at least a portion of the conductor connected to the picture elements.

2. The method of claim 1, wherein the conductor is made of the same material as the first electrode.

3. The method of claim 1, wherein the conductor is made of material different from the first electrode.

4. The method of claim 1, wherein the first electrodes and the display elements are simultaneously deposited.

5. A method for preparation of an active matrix substrate comprising:
   (a) forming a first electrode in a designated pattern on a first transparent substrate;
   (b) depositing an electrolytic polymer film containing a doping agent on the electrode by electrolytic polymerization;
   (c) depositing a transparent insulating film on at least a portion of the electrolytic polymer film such that at least a portion of the transparent insulating film is opposed to either a portion of the first transparent substrate or at least a portion of the first electrode with the electrolytic polymer film therebetween;
   (d) forming a contact hole through a designated part of the insulating film to expose a portion of the electrolytic polymer film;
   (e) depriving the doping agent contained in the electrolytic polymer film through the contact hole thereby forming a highly insulating electrolytic polymer film;
   (f) depositing a conductive material in a designated pattern thereby forming a conductor-insulator-conductor structure which functions as a nonlinear resistor; and
   (g) selectively depositing a picture element on or adjacent to the transparent conductor.

6. The method of claim 5, wherein the conductive material is made of the same material as the first electrode.

7. The method of claim 5, wherein the conductive material is made of a material different from the first electrode.

8. The method of claim 5, wherein a transparent conductor film is used as the first electrode on the transparent substrate and the first electrode and the picture element are formed simultaneously.

* * * * *